United States Patent [19]

Pan

[11] Patent Number: 4,810,332

[45] Date of Patent: Mar. 7, 1989

[54] METHOD OF MAKING AN ELECTRICAL MULTILAYER COPPER INTERCONNECT

[75] Inventor: Ju-Don T. Pan, Austin, Tex.

[73] Assignee: Microelectronics and Computer Technology Corporation, Austin, Tex.

[21] Appl. No.: 222,486

[22] Filed: Jul. 21, 1988

[51] Int. Cl.⁴ .............................................. C25D 5/02
[52] U.S. Cl. ..................................................... 204/15
[58] Field of Search ..................... 204/15, 38.1, 38.4, 204/40

[56] References Cited

U.S. PATENT DOCUMENTS

| | | | |
|---|---|---|---|
| 3,745,094 | 7/1973 | Greene | 204/15 |
| 4,082,591 | 4/1978 | Morisaki et al. | 156/150 |
| 4,159,222 | 6/1979 | Lebow et al. | 156/632 |
| 4,190,474 | 2/1980 | Berdan et al. | 156/151 |
| 4,233,344 | 11/1980 | Brasch | 427/304 |
| 4,409,037 | 10/1983 | Landau | 148/6.14 R |

OTHER PUBLICATIONS

Jensen et al, Copper/Polyimide Materials for High Performance Packaging, 12/84, IEEE Transactions on Components, Hybrids, and Mfg. Tech., vol. CHMT-7, #4, pp. 384-393.

Taylor et al., The Wafer Transmission Module-Wafer Scale Integration Packaging, 1985, IEEE 1985 Custom Integrated Circuits Conference, pp. 55-58.

Primary Examiner—T. M. Tufariello
Attorney, Agent, or Firm—Fulbright & Jaworski

[57] ABSTRACT

A method of making an electrical multilayer copper interconnect in which the electrical lines are protected by an electroplated overcoat. A plating interconnect is deposited on a substrate, a sacrificial layer of dielectric material is deposited on the plating interconnect. Thereafter a plating mask is formed on the dielectric material. Two self-aligned plating masks are patterned in one step, one of which is a plating mask for copper plating and the other is a plating mask for the overcoat. Preferably, before electroplating the overcoat, the copper is etched for exposing the sides adjacent the dielectric layer for allowing overcoating all of the copper.

7 Claims, 5 Drawing Sheets

METHOD OF MAKING AN ELECTRICAL MULTILAYER COPPER INTERCONNECT

BACKGROUND OF THE INVENTION

Advances in integrated circuits used in high performance systems have created a demand for higher density electrical interconnections to accommodate large numbers of input and outputs. Copper is the preferred conductor for such high density multilayer interconnects. The drawback of copper is that it is very subject to corrosion and oxidation. To fabricate reliable multilayer copper interconnects, the copper needs to be protected by other materials.

The present invention is directed to an easy and economical method to fabricate an electrical multilayer copper interconnect having high density copper lines in a multilayer interconnect system in which the copper lines are protected by protective coating.

SUMMARY OF THE INVENTION

The present invention is directed to a method of making an electrical multilayer copper interconnect in which the electrical lines are protected by an electroplated overcoat. The method includes patterning two self-aligned plating masks in one photolithographic step in which one of the plating masks is for copper plating and the other of the plating masks is for the protective coating for the copper.

Another feature of the present invention of making a copper interconnect is depositing a plating interconnect on a substrate, depositing a sacrificial layer of dielectric material on the plating interconnect, forming a plating mask on the dielectric material, etching away the dielectric material through the plating mask, plating a copper conductor into the etched-away dielectric, and stripping away the plating mask. Thereafter, the method includes forming a pillar plating mask on top of the conductor, plating a copper pillar onto the conductor, and stripping the pillar plating mask. Thereafter, an overcoat layer is electroplated on the exposed surface of the copper pillar and conductor and the sacrificial dielectric layer is stripped.

Still a further feature of the present invention includes the step of, before electroplating the overcoat, the copper is etched for exposing the sides adjacent the dielectric layer for allowing overcoating all of the exposed copper.

Still a further object of the present invention is where preferably the dielectric material is polyimide and the overcoat material is chemically inert, such as nickel (Ni) or chromium (Cr).

Still a further object of the present invention is the method of making a multilayer copper interconnect is depositing a plating interconnect on a substrate, depositing a layer of polyimide on the plating interconnect, forming a conductor plating mask on the polyimide and patterning the conductor plating mask and the polyimide in a self-aligned pattern for a conductor. Thereafter, a copper conductor is electroplated into the pattern and connected to the interconnect and the conductor plating mask is then stripped away. A pillar mask is formed on top of the conductor and a copper pillar is electroplated onto the conductor through the mask. The mask is stripped. The sides of copper conductor are etched away adjacent the polyimide and an overcoat layer is electroplated onto the exposed surface of the copper pillar and conductor for protecting them from the environment. The layer of polyimide is then stripped away and the plating interconnect below the stripped polyimide is stripped away.

Further objects, features and advantages will be apparent from the following description of presently preferred embodiments of the invention, given for the purpose of disclosure and taken in conjunction with the accompanying drawings.

DETAILED DESCRIPTION OF PREFERRED EMBODIMENTS

Figure 1:
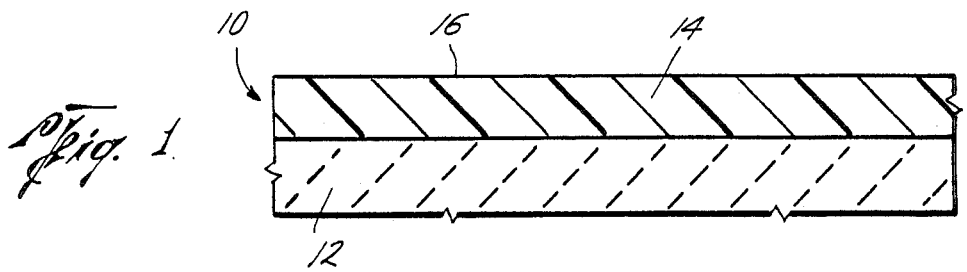
FIGS. 1-14 are fragmentary elevational views in cross-section illustrating the method of manufacture of an electrical multilayer copper interconnect in accordance with the present invention, illustrating successive stages in the manufacturing process.

Referring now to FIG. 1, the referenced numeral 10 generally indicates any suitable substrate. In the preferred embodiment, the substrate 10 includes a ceramic base 12, such as alumina ceramic or glass ceramic covered with a starting polyimide layer 14 having a polished surface 16. The polyimide layer 14 may have any suitable thickness, such as 10 um. However, the substrate 10 may be of other suitable materials, such as a silicon base with other dielectrics.

Figure 2:
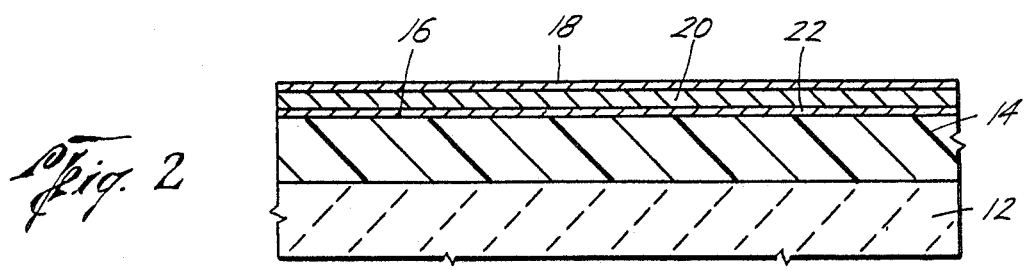

Referring now to FIG. 2, a plating interconnect consisting of layers 18, 20 and 22 is deposited on the surface 16 of the substrate 10. In the preferred embodiment, a sputter deposited titanium layer 18, a copper layer 20, and a titanium layer 22 sandwich is used as the plating interconnect. The bottom titanium layer 22 is used as an adhesion layer for the pre-plate copper layer 20 and the top titanium layer 18 is used as a protective coat to prevent the copper layer 20 from oxidizing after deposition. For example only, the titanium layer 18 may be 500 angstroms thick, the copper layer 20 may be 2500 angstroms thick and the titanium layer 22 may be 500 angstroms thick. Other suitable plating interconnects may consist of a sandwich layers of chromium/copper/chromium.

Figure 3:
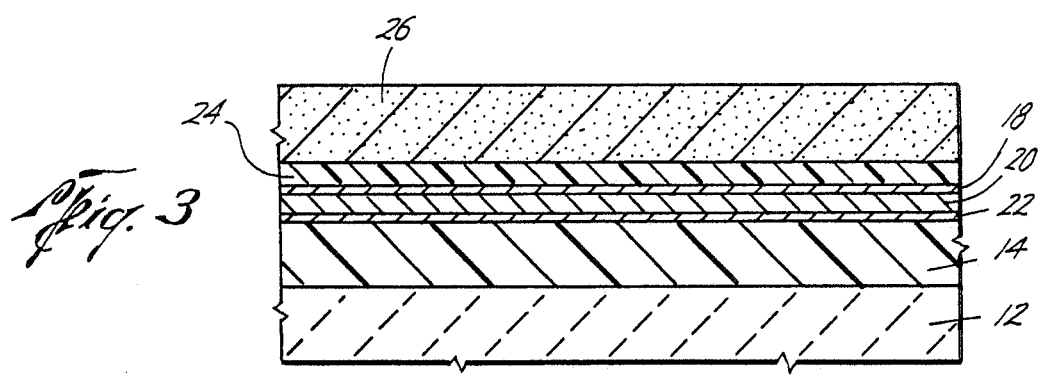

Referring now to FIG. 3, a sacrificial layer of dielectric material 24 is deposited on the interconnect layer of titanium/copper/titanium. Preferably the material 24 is a layer of polyimide which may be of any suitable thickness, such as between 500 to 4,000 angstroms. Other dielectric material can be used, such as silicon oxide or silicon nitride, either of which may be chemical vapor deposited or sputtered. On top of the layer 24, a conventional plating mask of thick photoresist 26 is formed.

Figure 4:
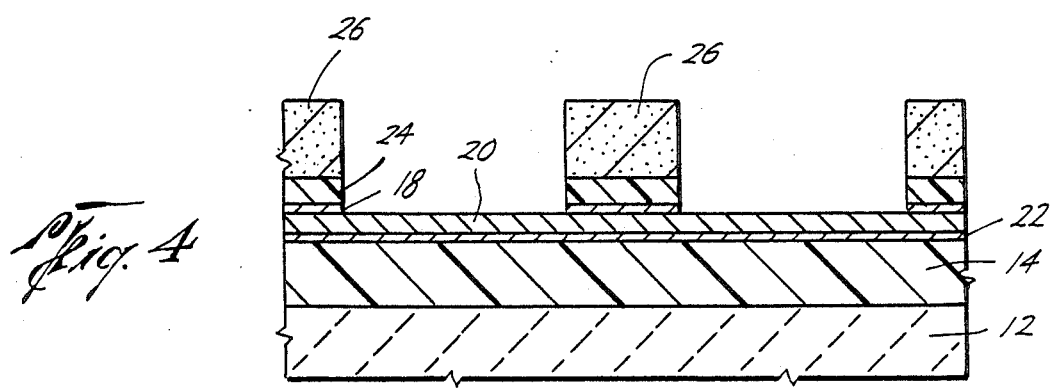

Referring now to FIG. 4, the photoresist 26 is patterned through standard lithographic methods as the plating mask for pattern plating an electrical conductor such as a reference plane, x-line or y-line. The polyimide layer 24 can be developed out at the same time the resist 26 is developed, if it is low temperature cured. Or the polyimide layer 24 can be dry-etched if it is cured to the degree that it cannot be developed out. It is noted in FIG. 4 that the polyimide laYer 24 is etched away using the plating mask as a mask. Also the top titanium layer18 was stripped in a mild solution, such as 0.5% hydroflouric solution, thereby forming a pattern for a copper conductor to be electroplated to the copper layer 20.

As shown in FIG. 4, the present method patterns, in one step, two separate plating masks, one for copper plating and one for a protective coating for the copper as will be described hereinafter. Also, since the polyimide layer 24 is patterned at the same time as the photoresist 26 is patterned, the layer 24 is self-aligned to the copper features.

Figure 5:
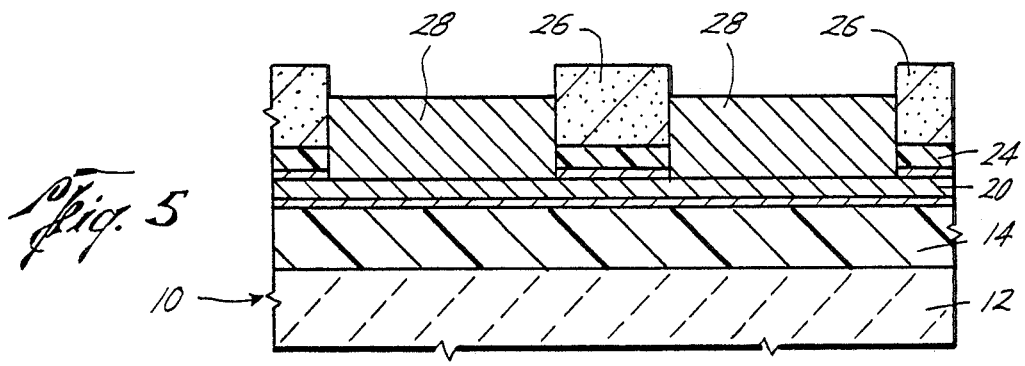

Referring now to FIG. 5, copper conductors 28, for example reference planes, are electroplated to the copper layer 20 in the pattern formed by the photoresist 26 and polyimide layer 24.

Figure 6:
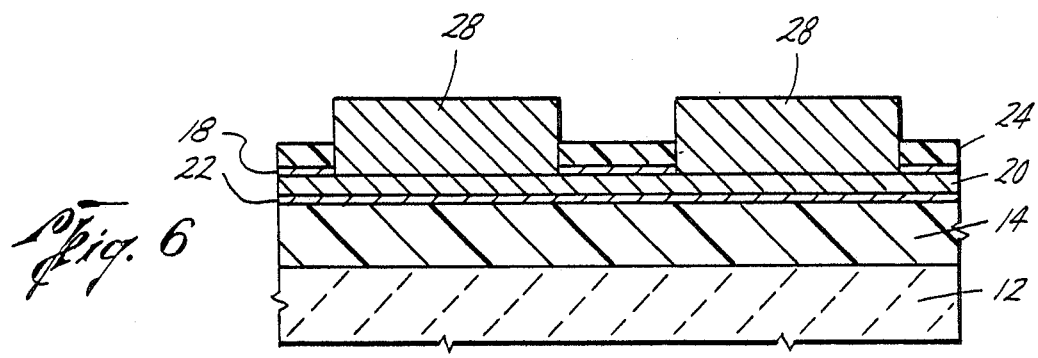

In FIG. 6, the photoresist 26 has been stripped as is conventional, however, it is noted that the only requirement for curing of the polyimide layer 24 is that it be resistant to the resist stripper so that it will remain upon the substrate to provide a pattern later on in the process for the protective coating for the copper.

Figure 7:
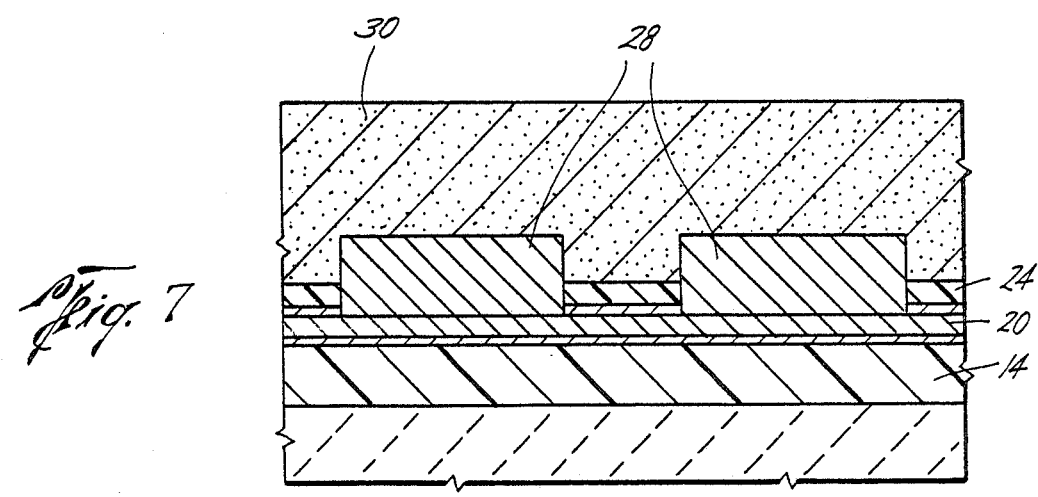

Referring now to FIG. 7, a thick layer 30 of photoresist for forming a pillar plating mask is provided on top of the conductors 28.

Figure 8:
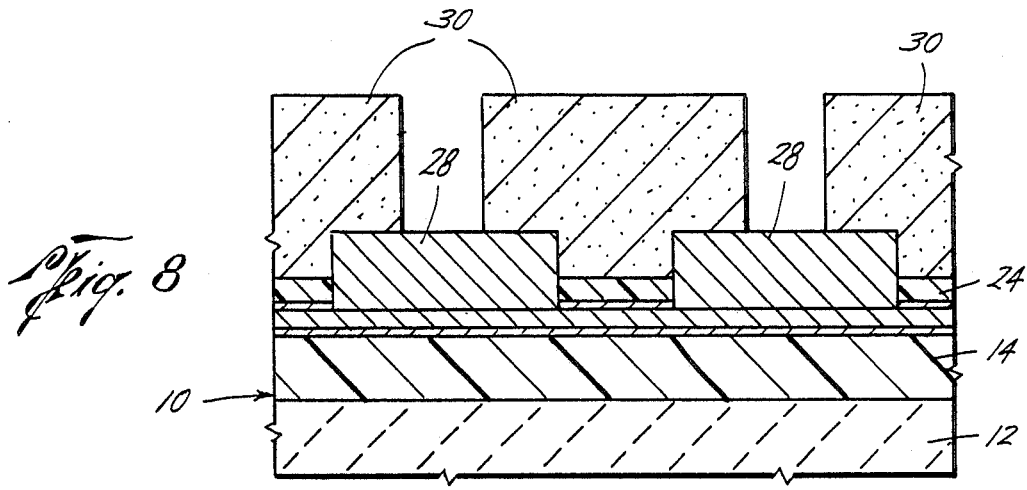

In FIG. 8, the resist 30 is patterned as is conventional to form patterns for electroplating vias or pillars onto the conductors 28.

Figure 9:
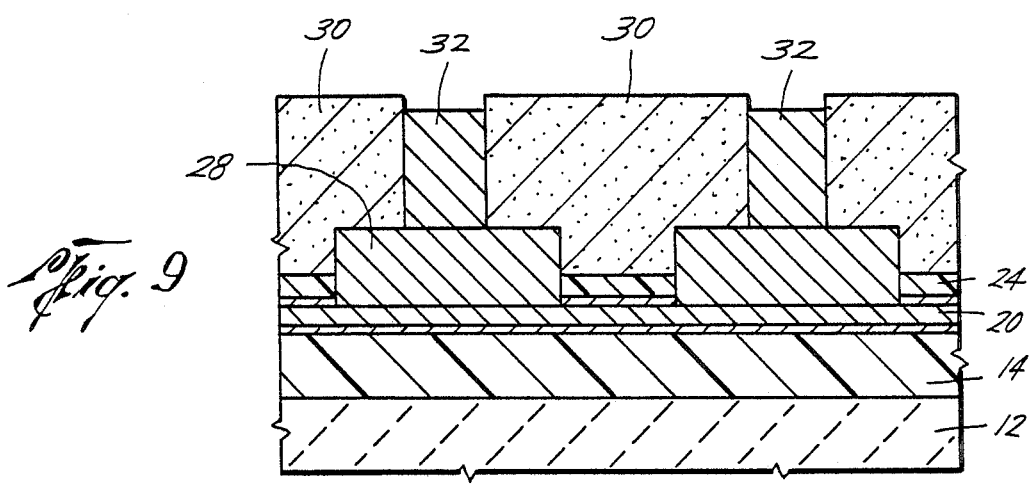
Figure 10:
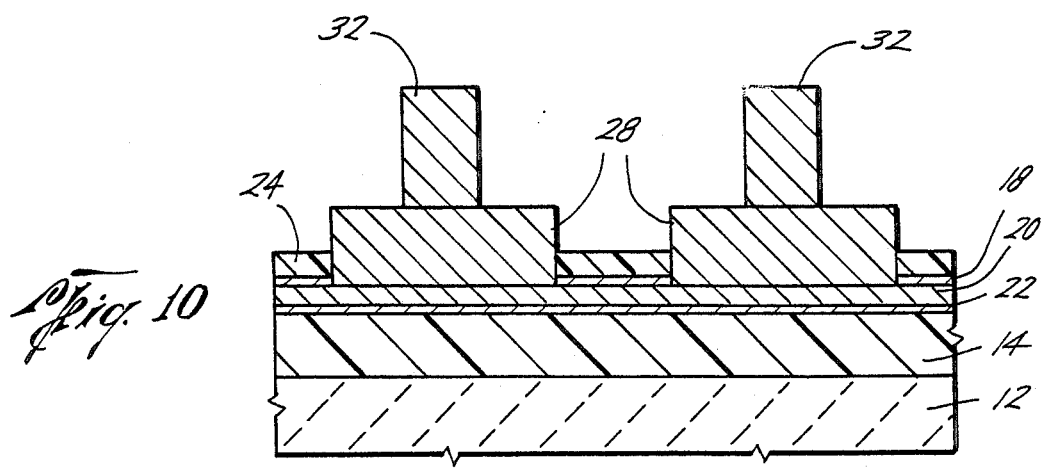

Referring now to FIG. 9, the pillars 32 are copper which are electroplated onto the conductors 28 and, as best seen in FIG. 10, the photoresist 30 is conventionally stripped leaving the copper pillars 32, copper conductors 28 and polyimide layer 24 exposed.

It has been noted that in copper/polyimide interconnects the copper which is in contact with polyimide will discolor indicating its oxidation or corrosion. This oxidation frequently results in some amount of delamination. Therefore, to enhance the reliability of the interconnect an overcoat is provided to protect the copper from oxidation and corrosion and to enhance the adhesion of polyimide to copper. If desired, the structure shown in FIG. 10 may be electroplated to plate an overcoat of a protective layer on the exposed surfaces of the copper pillars 32 and conductors 28 which includes the exposed top surface and side walls. The sacrificial dielectric layer 24 acts as a protective layer over the plating interconnect layers consisting of titanium 18, copper 20 and titanium 22 so that no overcoat material gets plated on the plating interconnect surface. The overcoat material can be nickel, chromium or any material that can be electroplated. After overcoating, the sacrificial dielectric layer 24 is stripped away, followed by the titanium 18, copper 20 and titanium 22 layers outside of the conductors 28. However, if the overcoat is coated directly onto the structure shown in FIG. 10, the lower portion of the copper conductors 28 which are contacted by the layers 24 and 18 are shielded during the overcoating electroplating and, thus, there is no overcoat at these locations. This small amount of exposed copper surface may not cause any reliability problem.

Figure 11:
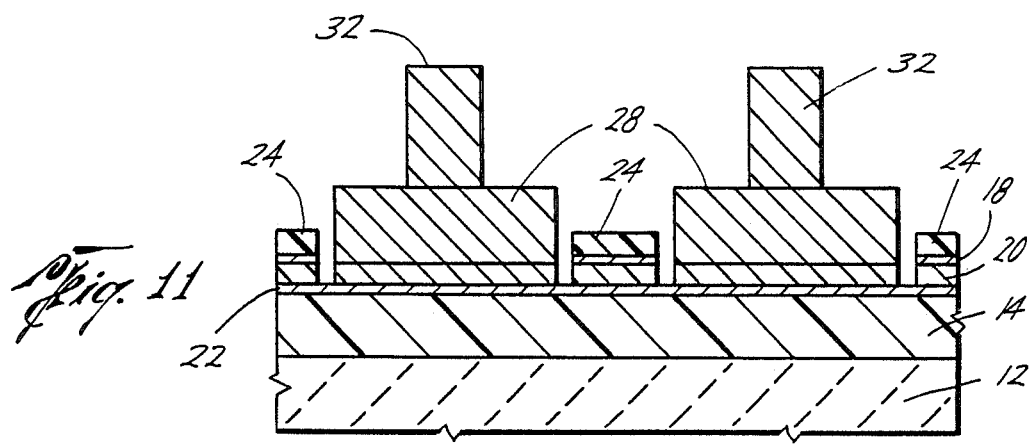
Figure 12:
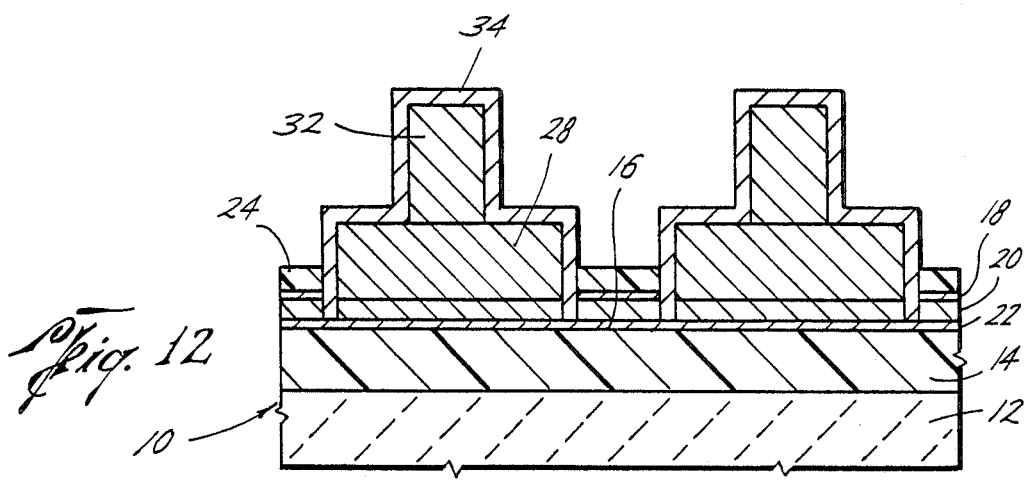

However, if a complete copper overcoat is desired, including all of the lower portion of the side walls of the conductors 28, the present process includes the steps shown in FIGS. 11 and 12. In FIG. 11, a light copper etch is applied to the copper pillars 32 and conductors 28 such as by etching them back a small amount such as 3,000 angstroms by the use of any suitable copper etch such as an ammonium persulfate/phosphoric acid solution. The copper etch will shrink the copper conductor slightly in its lateral dimension, expose the copper sidewall, and will etch downward through copper layer 20 and stop at titanium layer 22. Thus, as best seen in FIG. 11, the sides of the conductors 28 and copper layer 20 are now entirely exposed.

As best seen in FIG. 12, a protective overcoat 34, such as 7000 angstroms thick, may be electroplated on all of the exposed surfaces of the pillars 32 and conductors 28. The use of the self-aligned layer 24 of sacrificial dielectric allows an electrolytic plating approach to overcoat the copper conductor 28, pillars 32, and layer 20 while achieving selectively over the surface 16 of the substrate 10, that is, without plating between the conductors 28.

Figure 13:
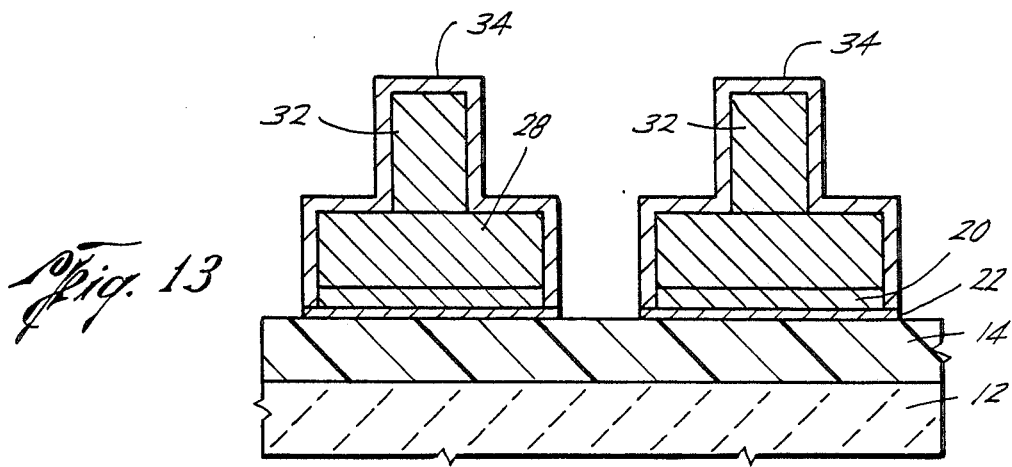

Referring now to FIG. 13, the dielectric polyimide layer 24 and the remaining plating interconnect under the layer 24 consisting of titanium 18, copper 20 and titanium 22 are stripped to disconnect connections between adjacent electrical conductors 28.

Figure 14:
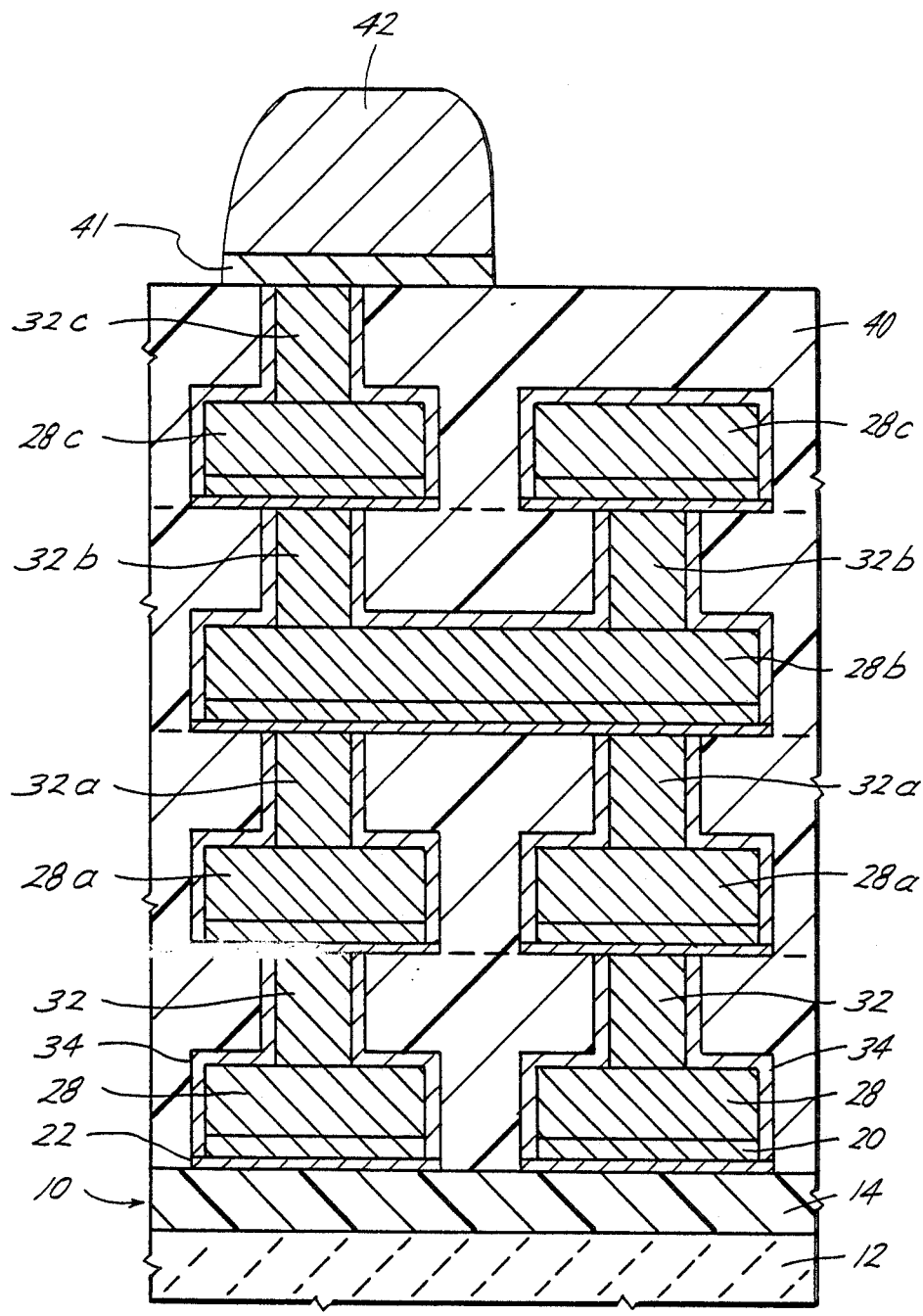

Thereafter, the structure shown in FIG. 13 is ready for conventional polyimide deposition and polishing for planarization. More levels of conductors and reference planes can be fabricated by repeating the above-described sequence of operations. In the example given in FIG. 14, electrical conductors 28a may be copper x-lines, conductor 28b may be a copper y-line, conductor 28c is an additional reference plane with interconnecting pillars 32a, 32b, and 32c, all enclosed in a polyimide enclosure 40. Thus, the process sequence described in this invention is repeated to fabricate a high-density multilayer interconnect. Also, on top of the multilayer copper interconnect bonding pads 42 and barrier/adhesion layer 41 can be fabricated as is conventional to form bonding pad for component bonding to the interconnect.

The overcoat has been demonstrated, using a blanket nickel overcoat over plated copper to provide excellent protection for copper against oxidation/corrosion during the 390° C. polyimide curing with the polyimide 40 over the conductors and pillars. The present self-alignment overcoat process does not require any additional masking operation and greatly accelerates the manufacture of copper/polyimide interconnects.

The present invention, therefore, is well adapted to carry out the objects and attain the ends and advantages mentioned, as well as others inherent therein. While presently preferred embodiments of the invention have been described for the purpose of disclosure, numerous changes in the details of construction, and steps of the process, will be readily apparent to those skilled in the art and which are encompassed within the spirit of the present invention and the scope of the appended claims.

What is claimed is:

1. A method of making an electrical multilayer copper interconnect comprising, depositing a plating interconnect on a substrate, depositing a sacrificial layer of dielectric material on the plating interconnect, forming a plating mask on the dielectric material, etching away the dielectric material through the plating mask, plating a copper conductor into the etched away dielectric, stripping away the plating mask, forming a pillar plating mask on top of the conductor, plating a copper pillar onto the conductor, stripping the pillar plating mask, electroplating an overcoat layer on the exposed surface of the copper pillar and conductor, and stripping the sacrificial dielectric layer.

2. The method of claim 1 including, before electroplating the overcoat, etching the copper for exposing the sides adjacent to the dielectric layer for allowing overcoating all of the copper.

3. The method of claim 1 wherein the dielectric material is polyimide.

4. The method of claim 1 including stripping the plating interconnect below the stripped dielectric layer.

5. The method of claim 1 wherein the overcoat is from a group consisting of nickel and chromium.

6. The method of claim 1 wherein the dielectric material is resistant to the stripping of the plating mask.

7. A method of making an electrical multilayer copper interconnect comprising,
  depositing a plating interconnect on a substrate,
  depositing a layer of polyimide on the plating interconnect,
  forming a conductor plating mask on the polyimide,
  patterning the conductor plating mask and the polyimide in a self-aligned pattern for a conductor,
  electroplating a copper conductor into the pattern and connected to the interconnect,
  stripping away the conductor plating mask,
  forming a pillar mask on top of the conductor,
  electroplating a copper pillar onto the conductor,
  stripping the pillar plating mask,
  etching away the copper sides adjacent the polyimide, and
  electroplating an overcoat layer on the exposed surface of the copper pillar and conductor,
  stripping the layer of polyimide away, and
  stripping the plating interconnect below the stripped polyimide.

* * * * *

UNITED STATES PATENT AND TRADEMARK OFFICE
CERTIFICATE OF CORRECTION

PATENT NO. : 4,810,332
DATED : March 7, 1989
INVENTOR(S) : Ju-Don T. Pan

It is certified that error appears in the above—identified patent and that said Letters Patent is hereby corrected as shown below:

Column 1, line 54, delete "is" and insert -- by --

Column 2, line 61, delete "laYer" and insert -- layer --

Column 2, line 64, delete "hydroflouric" and insert -- hydrofluoric --

Column 4, line 30, delete "pad" and insert -- pads --

Signed and Sealed this

Twenty-fourth Day of October, 1989

Attest:

DONALD J. QUIGG

Attesting Officer

Commissioner of Patents and Trademarks